(12) United States Patent
Tian et al.

(10) Patent No.: US 11,854,790 B2
(45) Date of Patent: Dec. 26, 2023

(54) GLOBAL SHUTTER CMOS IMAGE SENSOR AND METHOD FOR MAKING THE SAME

(71) Applicant: Shanghai Huali Microelectronics Corporation, Shanghai (CN)

(72) Inventors: Zhi Tian, Shanghai (CN); Zhen Gu, Shanghai (CN); Hua Shao, Shanghai (CN); Haoyu Chen, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 18/063,808

(22) Filed: Dec. 9, 2022

(65) Prior Publication Data

US 2023/0107371 A1    Apr. 6, 2023

Related U.S. Application Data

(62) Division of application No. 16/951,606, filed on Nov. 18, 2020, now Pat. No. 11,735,610.

(30) Foreign Application Priority Data

Aug. 18, 2020 (CN) .......................... 202010832325.1

(51) Int. Cl.
*H01L 27/146* (2006.01)
(52) U.S. Cl.
CPC .... *H01L 27/14616* (2013.01); *H01L 27/1463* (2013.01); *H01L 27/14612* (2013.01); *H01L 27/14643* (2013.01); *H01L 27/14689* (2013.01); *H01L 27/1464* (2013.01)

(58) Field of Classification Search
CPC ......... H01L 27/14612; H01L 27/14616; H01L 27/1463; H01L 27/14643; H01L 27/14689
See application file for complete search history.

(56) References Cited

U.S. PATENT DOCUMENTS

| | | | | |
|---|---|---|---|---|
| 2004/0051801 A1* | 3/2004 | Iizuka | .................. | H04N 25/623 348/E3.029 |
| 2009/0303366 A1* | 12/2009 | Gambino | .......... | H01L 27/14623 348/308 |
| 2014/0231879 A1* | 8/2014 | Meynants | ......... | H01L 27/14616 257/230 |
| 2016/0286151 A1* | 9/2016 | Lahav | ............... | H01L 27/14643 |
| 2019/0067353 A1* | 2/2019 | Tsao | .................. | H01L 27/14636 |

* cited by examiner

*Primary Examiner* — Brigitte A Paterson
(74) *Attorney, Agent, or Firm* — Banner & Witcoff, Ltd.

(57) ABSTRACT

The disclosure discloses a global shutter CMOS image sensor, which adopts non-uniform storage diffusion region doping to reduce the junction leakage at storage points, so as to ensure that with the increase of the depth of photodiodes and the increase of pixels, all carriers in rows read subsequently can be transferred to storage diffusion regions, the loss of the carriers in the storage diffusion regions is not caused when a global shutter transistor is turned on, and the carriers can be completely transferred from the storage diffusion regions to floating diffusion regions through second transfer transistors even if the number of rows of pixel units increases during reading-out row by row. The disclosure further discloses a method for making the global shutter CMOS image sensor.

8 Claims, 2 Drawing Sheets

GLOBAL SHUTTER CMOS IMAGE SENSOR AND METHOD FOR MAKING THE SAME

CROSS-REFERENCES TO RELATED APPLICATIONS

This application is a divisional of U.S. patent application Ser. No. 16/951,606, filed Nov. 18, 2020, which claims priority to Chinese Patent Application No. 202010832325.1, filed on Aug. 18, 2020, and entitled "Global Shutter CMOS Image Sensor and Method for Making the Same", the disclosure of which is incorporated herein by reference in its entirety.

TECHNICAL FIELD

The present disclosure relates to a semiconductor technology, and in particular to a global shutter (GS) CMOS image sensor (CIS) and a method for making the same.

BACKGROUND

With the development of automobile industry, Internet of Things and monitoring equipment, the consumption of image sensors is gradually increasing. The current mainstream image sensor technology is CMOS image sensor technology compatible with CMOS technology, and the Backside Illumination (BSI) structure which can capture more light has become the mainstream.

Recently, the demand of Near Infrared (NIR) for vehicle recorders and monitoring equipment is gradually increasing, which is mainly used for image capture under conditions of dark light, such that images can obtain more details. For the acquisition of near infrared light (with wavelength greater than 760 nm), there are two main structures and methods commonly used for Frontside Illumination (FSI) CMOS image sensors. One is to realize ultra-deep boron (B) implantation (with energy greater than 4 MeV) and phosphorus (P) implantation (with energy greater than 7 MeV) on an N-type substrate through ultra-high-energy implantation. These pinned photodiodes can reach a depth of 6 um, and have a good electrical isolation effect and a strong barrier effect to isolate illuminated pixels and adjacent pixels. The other is to use a thick high-resistance P-type substrate. In this method, the collection efficiency depends on the thickness of an initial wafer and the experienced thermal budget. The high-resistance substrate is mainly used to reduce the interference of adjacent pixels caused by potential induced by the pinned photodiodes.

With the decrease of pixel units, BSI configuration is adopted for the CMOS image sensors to increase light input. The light input of the BSI CMOS image sensors is increased because of no metal shielding.

The intensity of four wavelengths varies with depth. In silicon, the depth at which blue light is attenuated to 1/e is about 0.42 um, the depth at which green light is attenuated to 1/e is 1.40 um, the depth at which red light is attenuated to 1/e is 2.42 um, and the absorption range of near infrared light is very deep since the wavelength is large. The larger the wavelength, the stronger the parasitic effect of the corresponding storage node. For near infrared devices, it will be more serious.

Because of the need to thin silicon wafers to increase light transmission, while considering the absorption of visible red light, it is generally defined as 2.4 um (the intensity of red light is 1/e of the original intensity). The existing near infrared design focuses on the requirement of continuous image processing (video monitoring, driving recorder and automatic driving cameras), but less consideration is given to the combination with static high speed. For global shutters capable of realizing high-speed photography, the existing global shutter technology uses tungsten to shield storage nodes, so as to realize accurate signal transfer. With the requirements of small pixel units and high pixels, new requirements are put forward for the realization of near infrared global technology. Due to the large depth of near infrared photodiodes, it takes longer time to clear residual electrons by using a shutter gate, which leads to the loss of electrons at storage diffusion points; with the increase of pixels, the number of rows increases and reading-out is realized row by row, such that the storage time of the electrons in the finally read rows (above the pixel regions) is longer, and the electrons are more likely to be lost, resulting in the decrease of the quality of final images.

FIG. 1 is a schematic structural view of a pixel unit circuit of an existing 6T global shutter CMOS image sensor. Each pixel unit of the global shutter CMOS image sensor includes a photodiode (PD), a storage diffusion region (SD) 106, and a first resetting region 105.

The photodiode includes a second conducting type semiconductor layer 101, and a first conducting type first photosensitive doped region 103 formed on the top of the semiconductor layer 101. The semiconductor layer 101 is a silicon layer. The first photosensitive doped region 103 is an ion implantation region. In FIG. 1, the bottom of the first photosensitive doped region 103 further includes first conducting type doped regions 1031 and 1032. The doping concentration of the doped region 1031 is less than the doping concentration of the doped region 1032, and the doping concentration of the doped region 1032 is less than the doping concentration of the first photosensitive doped region 103.

The storage diffusion region 106 is subjected to first conducting type doping, a gate structure of a first transfer transistor M2 is formed at the top of the semiconductor layer 101 between the first photosensitive doped region 103 and the storage diffusion region 106, and the gate structure is formed by a gate dielectric layer 110 and a polysilicon gate 111 in a superposed manner.

The first resetting region 105 is subjected to first conducting type doping, the first resetting region 105 is used to connect with power supply voltage, and a gate structure of a global shutter transistor M1 is formed at the top of the semiconductor layer 101 between the first photosensitive doped region 103 and the first resetting region 105.

A pinned layer 104 subjected to second conducting type doping is formed on the surface of the first photosensitive doped region 103.

Each pixel unit of the CMOS image sensor further includes a floating diffusion region (FD) 108, and a gate structure of a second transfer transistor M3 is formed at the top of the semiconductor layer 101 between the floating diffusion region 108 and the storage diffusion region 106.

Each pixel unit of the CMOS image sensor further includes a reset transistor M4, a gate structure of the reset transistor M4 is provided between the floating diffusion region 108 and a second resetting region 109, the second resetting region 109 is subjected to first conducting type doping, and the second resetting region 109 is connected with power supply voltage VDD. The floating diffusion region 108 and the second resetting region are formed in a second conducting type well 107.

Generally, the first conducting type is N-type and the second conducting type is P-type. The first conducting type may also be P-type and the second conducting type may also be N-type.

Each pixel unit of the CMOS image sensor further includes an amplify transistor M5 and a select transistor M6, a gate of the amplify transistor M5 is connected with the floating diffusion region 108, a source of the amplify transistor M5 is outputs an amplified signal, a drain of the amplify transistor M5 is connected with power supply voltage VDD, the select transistor M6 is used to select and output an amplified signal output by the amplify transistor M5, and a gate of the select transistor M6 is connected with a select signal Rs.

A shallow trench isolation 102 structure surrounds the peripheral side of each pixel unit of the CMOS image sensor.

By taking that the first conducting type is N-type and the second conducting type is P-type as an example, the operation sequence of the pixel unit circuit of the existing 6T global shutter CMOS image sensor is as follows:

(1) Light enters the photodiode (PD) to generate photo-generated carriers, and photoelectrons enter the first photosensitive doped region 103 of the photodiode (PD).

(2) The first transfer transistor M2 is turned on to transfer the charges of all pixel units from the first photosensitive doped region 103 to the storage diffusion region (SD) 106.

(3) The first transfer transistor M2 is turned off such that photo-generated electrons exist in the storage diffusion region (SD) 106.

(4) The gate, i.e., the gate structure of the global shutter transistor M1 connected to the photodiode (PD) is opened such that the residual charges in the first photosensitive doped region 103 of the photodiode (PD) is transferred to the first resetting region 105, and at the same time, the generation of additional photons due to any photosensitization can be avoided.

The charges are read out row by row from the storage diffusion region (SD) 106 through the second transfer transistor M3 and the floating diffusion region 108.

The existing global shutter CMOS image sensor has the following technical problems:

(1) In Near Infrared (NIR) technology, in order to increase the amount of infrared light, the depth of the photodiode (PD) is greater than normal, which leads to longer transfer time. It is difficult to ensure that all electrons in the photodiode (PD) of the entire pixel are transferred to the storage diffusion region (SD) at the same time.

(2) With the wide application of Near Infrared (NIR) technology, the size is reduced, which leads to the increase of the junction leakage at the gate of the global shutter transistor M1, resulting in the loss of electrons in the storage diffusion region (SD). N-m electrons of N electrons in the photodiode (PD) are transferred to the storage diffusion region (SD), and m electrons are lost. It is difficult to ensure that when the global shutter transistor M1 is turned on, the loss of the electrons in the storage diffusion region (SD) will not be caused.

(3) When N rows of pixel units are read out row by row, if the charges in the storage diffusion regions (SD) of the last few rows are lost (flow to the photodiode (PD), resulting in junction leakage, since the floating diffusion region (FD) is at a low potential at this moment, junction leakage is not caused), the original signal cannot be ensured. This is more serious with the increase of pixels, the increase of the number of rows and the increase of reading time. It is difficult to ensure that the electrons from the storage diffusion region (SD) can be completely transferred to the floating diffusion region (FD) through the second transfer transistor M3 during reading-out row by row.

BRIEF SUMMARY

The technical problem to be solved by the disclosure is how to ensure that all carriers in rows read subsequently by a global shutter CMOS image sensor can be transferred to storage diffusion regions with the increase of the depth of a photodiode and the increase of pixels, and the carriers in the storage diffusion region are not lost when a global shutter transistor is turned on.

In order to solve the above technical problem, the disclosure provides a global shutter CMOS image sensor, which includes N rows of pixel units sequentially arranged from the front to the rear, each pixel unit includes a first resetting region 105, a global shutter transistor M1, a photodiode, a first transfer transistor M2, a storage diffusion region 106, a second transfer transistor M3, a floating diffusion region 108, a reset transistor M4 and a second resetting region 109 arranged in turn;

the photodiode includes a second conducting type semiconductor layer 101 and a first conducting type first photosensitive doped region 103 formed on the top of the semiconductor layer 101;

the storage diffusion region 106 is subjected to first conducting type doping, and a gate structure of the first transfer transistor M2 is formed at the top of the semiconductor layer 101 between the first photosensitive doped region 103 and the storage diffusion region 106;

the first resetting region 105 is subjected to first conducting type doping, the first resetting region 105 is used to connect with power supply voltage, and a gate structure of the global shutter transistor M1 is formed at the top of the semiconductor layer 101 between the first photosensitive doped region 103 and the first resetting region 105;

a pinned layer 104 subjected to second conducting type doping is formed on the surface of the first photosensitive doped region 103;

a gate structure of the second transfer transistor M3 is formed at the top of the semiconductor layer 101 between the floating diffusion region 108 and the storage diffusion region 106;

the gate structure of the reset transistor M4 is formed between the floating diffusion region 108 and the second resetting region 109;

the second resetting region 109 is subjected to first conducting type doping, and the second resetting region 109 is connected with power supply voltage;

the floating diffusion region 108 and the second resetting region 109 are formed in a second conducting type well 107;

the concentration of first conducting type doping of the storage diffusion regions 106 of the front M rows of the N rows of pixel units is less than the concentration of first conducting type doping of the storage diffusion regions 106 of the remaining rear N-M rows, N is an integer greater than 10, and M is an integer less than or equal to N/2.

Preferably, the first conducting type is N-type and the second conducting type is P-type; or, the first conducting type is P-type and the second conducting type is N-type.

Preferably, for the concentration of first conducting type doping of the storage diffusion regions 106 of the front M rows of the N rows of pixel units, the concentration near the side of the photodiode is less than the concentration near the side of the floating diffusion region.

Preferably, the semiconductor layer 101 is a silicon layer; the first photosensitive doped region 103 is an ion implantation region;
a first conducting type first photosensitive lightly-doped region 1030 is formed in the semiconductor layer 101;
the first photosensitive lightly-doped region 1030 is located below the first photosensitive doped region 103 and extends horizontally below the first transfer transistor M2;
the doping concentration of the first photosensitive lightly-doped region 1030 is less than the doping concentration of the first photosensitive doped region 103.

Preferably, each pixel unit of the CMOS image sensor further includes an amplify transistor M5 and a select transistor M6;
a gate of the amplify transistor M5 is connected with the floating diffusion region 108;
a source of the amplify transistor M5 outputs an amplified signal;
a drain of the amplify transistor M5 is connected with power supply voltage;
the select transistor M6 is used to select and output an amplified signal output by the amplify transistor M5;
a gate of the select transistor M6 is connected with a select signal.

Preferably, shallow trench isolation 102 surrounds the peripheral side of each pixel unit of the CMOS image sensor.

Preferably, the gate structure is formed by a gate dielectric layer 110 and a polysilicon gate 111 in a superposed manner.

In order to solve the above technical problem, the disclosure provides a method for making the global shutter CMOS image sensor, two times of shallow layer ion implantation are performed to the storage diffusion regions 106 of the N rows of pixel units of the global shutter CMOS image sensor;
the first time of shallow layer ion implantation is first conducting type ion implantation, which is performed to all of the N rows of pixel units;
the second time of shallow layer ion implantation is second conducting type ion implantation, which is performed to the storage diffusion regions 106 of the front M rows of pixel units only.

Preferably, the first time of shallow layer ion implantation is performed in the entire storage diffusion regions 106;
the second time of shallow layer ion implantation is performed at positions where the storage diffusion regions 106 are adjacent to the first transfer transistors M2.

Preferably, the first conducting type is N-type and the second conducting type is P-type;
in the first time of shallow layer ion implantation of the storage diffusion regions 106, the impurity is phosphorus, the energy is 15 KeV-45 KeV, and the dose is 1E12-4E13;
in the second time of shallow layer ion implantation of the storage diffusion regions 106, the impurity is boron, the energy is 5 KeV-10 KeV, and the dose is 5E13-1E15.

In the global shutter CMOS image sensor and the method for making the global shutter CMOS image sensor provided by the disclosure, non-uniform storage diffusion region (SD) 106 doping is adopted to reduce the junction leakage at storage points, so as to ensure that with the increase of the depth of photodiodes (PD) and the increase of pixels, all carriers in rows read subsequently can be transferred to storage diffusion regions (SD) 106, the loss of the carriers in the storage diffusion regions (SD) 106 is not caused when the global shutter transistor M1 is turned on, and the carriers can be completely transferred from the storage diffusion regions (SD) 106 to the floating diffusion regions (FD) 108 through the second transfer transistors M3 even if the number of rows of pixel units increases during reading-out row by row.

BRIEF DESCRIPTION OF THE DRAWINGS

In order to more clearly describe the technical solution of the disclosure, the drawings which need be used in the disclosure will be briefly introduced below. Apparently, the drawings described below are some embodiments of the disclosure. Those skilled in the art may obtain other drawings according to these drawings without contributing any inventive labor.

DETAILED DESCRIPTION OF THE DISCLOSURE

The technical solution of the disclosure will be described below clearly and completely with reference to the drawings. Apparently, the described embodiments are partial embodiments of the disclosure, instead of all embodiments. Based on the embodiments of the disclosure, all other embodiments obtained by those skilled in the art without contributing any inventive labor shall fall into the scope of protection of the disclosure.

Embodiment 1

Figure 1:
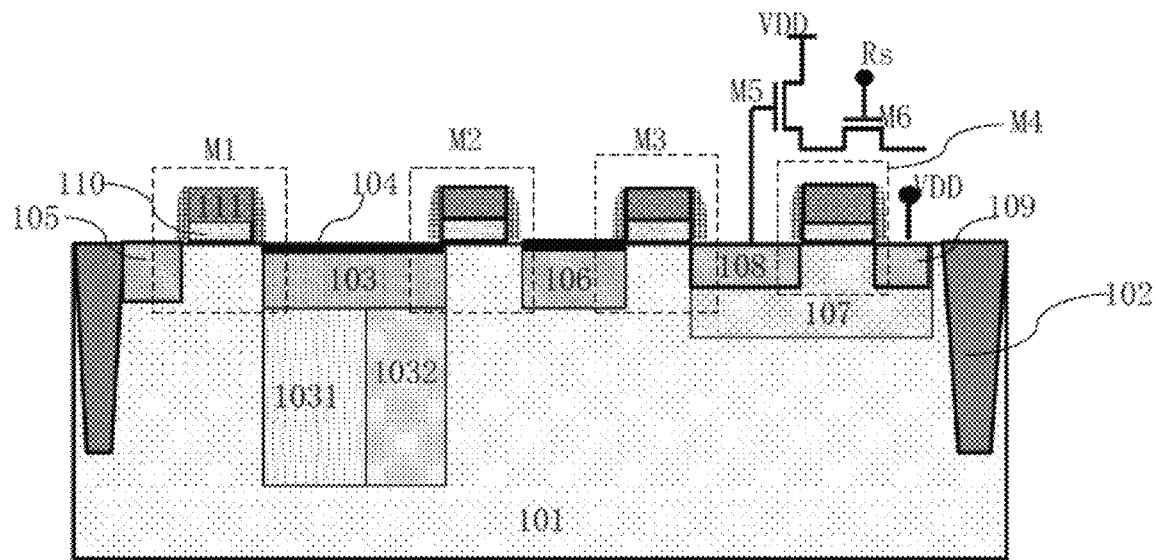
FIG. 1 is a schematic structural view of a pixel unit circuit of an existing 6T global shutter CMOS image sensor.
Figure 2:
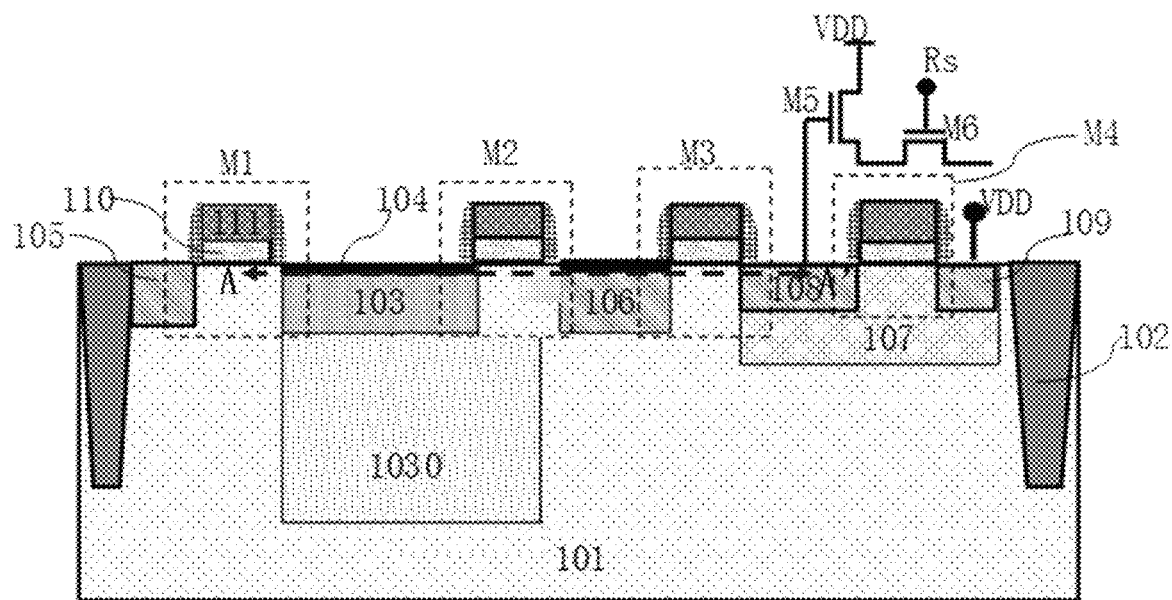
FIG. 2 is a schematic structural view of a pixel unit circuit of a global shutter CMOS image sensor according to one embodiment of the disclosure.

Referring to FIG. 2, a global shutter CMOS image sensor includes N rows of pixel units sequentially arranged from the front to the rear, each pixel unit includes a first resetting region 105, a global shutter transistor M1, a photodiode (PD), a first transfer transistor M2, a storage diffusion region (SD) 106, a second transfer transistor M3, a floating diffusion region (FD) 108, a reset transistor M4 and a second resetting region 109 arranged in turn;

The photodiode (PD) includes a second conducting type semiconductor layer 101 and a first conducting type first photosensitive doped region 103 formed at the top of the semiconductor layer 101.

The storage diffusion region (SD) 106 is subjected to first conducting type doping, and a gate structure of the first transfer transistor M2 is formed at the top of the semiconductor layer 101 between the first photosensitive doped region 103 and the storage diffusion region (SD) 106.

The first resetting region 105 is subjected to first conducting type doping, the first resetting region 105 is used to connect with power supply voltage (VDD), and a gate structure of the global shutter transistor M1 is formed at the top of the semiconductor layer 101 between the first photosensitive doped region 103 and the first resetting region 105.

A pinned layer 104 subjected to second conducting type doping is formed on the surface of the first photosensitive doped region 103.

A gate structure of the second transfer transistor M3 is formed at the top of the semiconductor layer 101 between the floating diffusion region (FD) 108 and the storage diffusion region (SD) 106.

The gate structure of the reset transistor M4 is formed between the floating diffusion region 108 and the second resetting region 109.

The second resetting region 109 is subjected to first conducting type doping, and the second resetting region 109 is connected with power supply voltage (VDD).

The floating diffusion region 108 and the second resetting region are formed in a second conducting type well 107.

The concentration of first conducting type doping of the storage diffusion regions (SD) 106 of the front M rows of the N rows of pixel units is less than the concentration of first conducting type doping of the storage diffusion regions (SD) 106 of the remaining rear N-M rows, N is an integer greater than 10, and M is an integer less than or equal to N/2.

The first conducting type is N-type and the second conducting type is P-type; or,
the first conducting type is P-type and the second conducting type is N-type.

The global shutter CMOS image sensor according to embodiment 1 adopts non-uniform storage diffusion region (SD) 106 doping to reduce the junction leakage at storage points, so as to ensure that with the increase of the depth of the photodiodes (PD) and the increase of pixels, all carriers in rows read subsequently can be transferred to the storage diffusion regions (SD) 106, the loss of the carriers in the storage diffusion regions (SD) 106 is not caused when the global shutter transistor M1 is turned on, and the carriers can be completely transferred from the storage diffusion regions (SD) 106 to the floating diffusion regions (FD) 108 through the second transfer transistors M3 even if the number of rows of pixel units increases during reading-out row by row.

Embodiment 2

Based on the global shutter CMOS image sensor according to embodiment 1, for the concentration of first conducting type doping of the storage diffusion regions 106 of the front M rows of the N rows of pixel units, the concentration near the side of the photodiode (PD) is less than the concentration near the side of the floating diffusion region (FD).

Embodiment 3

Based on the global shutter CMOS image sensor according to embodiment 1, the semiconductor layer 101 is a silicon layer;
the first photosensitive doped region 103 is an ion implantation region;
a first conducting type first photosensitive lightly-doped region 1030 is formed in the semiconductor layer 101;
the first photosensitive lightly-doped region 1030 is located below the first photosensitive doped region 103 and extends horizontally below the first transfer transistor M2;
the doping concentration of the first photosensitive lightly-doped region 1030 is less than the doping concentration of the first photosensitive doped region 103.

By adopting the global shutter CMOS image sensor according to embodiment 3, a Backside Illumination (BSI) photodiode (PD) can capture more light.

Embodiment 4

Based on the global shutter CMOS image sensor according to embodiment 1, each pixel unit of the CMOS image sensor further includes an amplify transistor M5 and a select transistor M6;
a gate of the amplify transistor M5 is connected with the floating diffusion region 108;
a source of the amplify transistor M5 outputs an amplified signal;
a drain of the amplify transistor M5 is connected with power supply voltage (VDD);
the select transistor M6 is used to select and output an amplified signal output by the amplify transistor M5;
a gate of the select transistor M6 is connected with a select signal Rs.

Preferably, shallow trench isolation 102 surrounds the peripheral side of each pixel unit of the CMOS image sensor.

Preferably, the gate structure is formed by a gate dielectric layer 110 and a polysilicon gate 111 in a superposed manner.

Embodiment 5

In a method for making the global shutter CMOS image sensor according to embodiment 1, two times of shallow layer ion implantation are performed to the storage diffusion regions (SD) 106 of the N rows of pixel units of the global shutter CMOS image sensor;
the first time of shallow layer ion implantation is first conducting type ion implantation, which is performed to all of the N rows of pixel units;
the second time of shallow layer ion implantation is second conducting type ion implantation, which is performed to the storage diffusion regions (SD) 106 of the front M rows of pixel units only.

In a method for making the global shutter CMOS image sensor according to embodiment 5, two times of ion implantation are performed to the storage diffusion regions (SD) 106 of the global shutter CMOS image sensor; the first time of ion implantation is first conducting type shallow layer ion implantation, which is performed to all of the N rows of pixel units, and the first time of shallow layer ion implantation makes the carriers of the storage diffusion regions (SD) 106 not transferred in case of junction leakage in the storage diffusion regions (SD) 106 within time that the global shutter transistor M1 is turned on, second conducting type shallow layer ion implantation is performed by using an additional mask at the second time, which is performed to the storage diffusion regions (SD) 106 of the front M rows of the N rows of pixel units only, the second time of implantation is inversion implantation to reduce the junction leakage in the storage diffusion regions (SD) 106.

Figure 3:
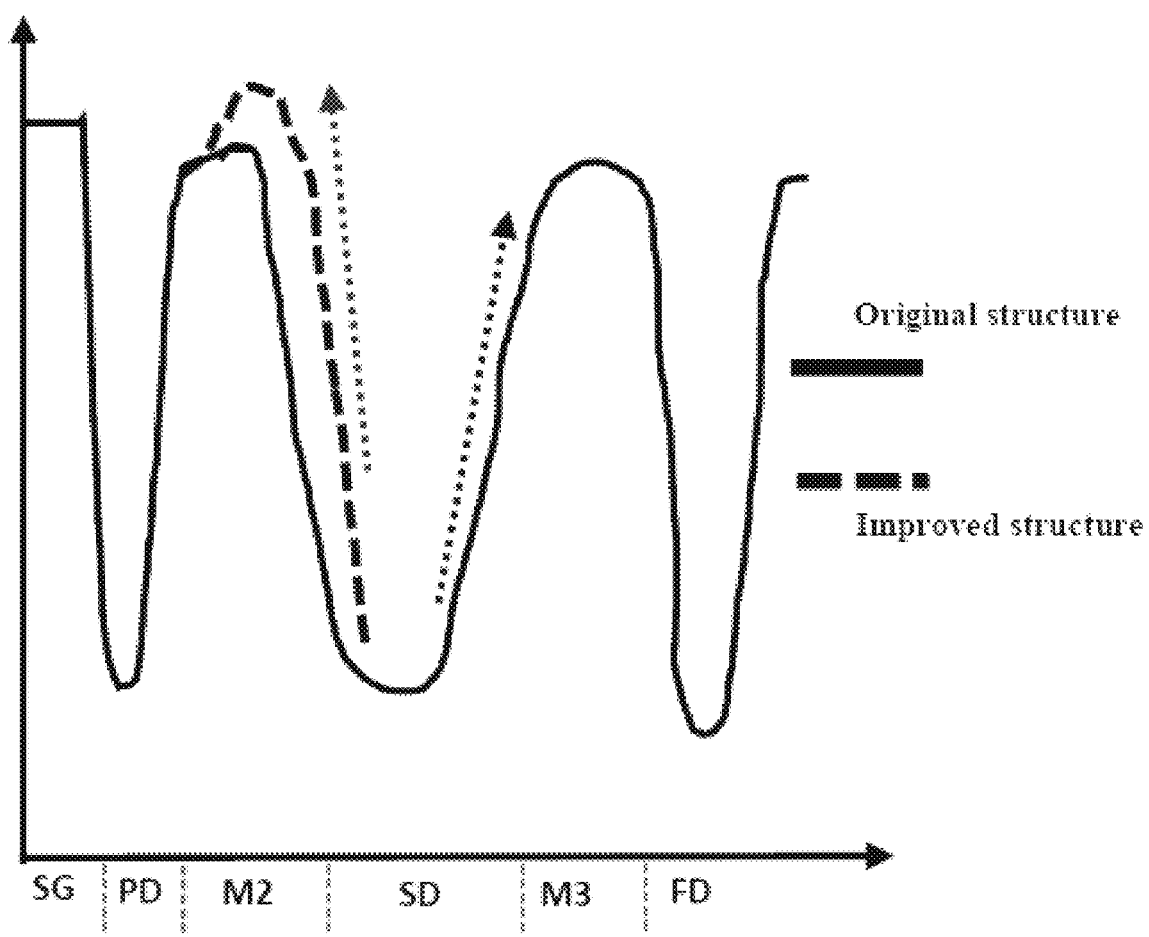
FIG. 3 is an AA' energy-potential diagram of pixel units of a global shutter CMOS image sensor according to one embodiment of the disclosure.

From FIG. 3, it can be seen that the new asymmetric inversion implantation increases the barrier in the storage diffusion regions (SD) 106 near the area of the photodiodes (PD). In the method for making the global shutter SMOS image sensor according to embodiment 5, the problem of junction leakage caused by the increase of the resetting and row-by-row reading time of the photodiodes of the small-size global shutter high-pixel near infrared CMOS image sensor is reduced by forming asymmetric non-uniform storage diffusion regions (SD) 106 through two times of ion implantation, so as to improve the image quality and ensure that the CMOS image sensor realizes small size, high pixel and global near infrared.

Embodiment 6

Based on the method for making the global shutter CMOS image sensor according to embodiment 5, the first time of shallow layer ion implantation is performed in the entire storage diffusion regions (SD) 106;
the second time of shallow layer ion implantation is performed at positions where the storage diffusion regions (SD) 106 are adjacent to the first transfer transistors M2.

In the method for making the global shutter CMOS image sensor according to embodiment 6, it can be ensured that the transfer of the carriers from the storage diffusion regions (SD) 106 to the floating diffusion regions (FD) 108 is not influenced by the turn-on of the global shutter transistors M1 during subsequent actual reading, no internal potential is formed and the reading speed can be increased.

Embodiment 7

Based on the method for making the global shutter CMOS image sensor according to embodiment 5, the first conducting type is N-type, and the second conducting type is P-type;
in the first time of shallow layer ion implantation of the storage diffusion regions 106, the impurity is phosphorus (P), the energy is 15 KeV-45 KeV, and the dose is 1E12-4E13;
in the second time of shallow layer ion implantation of the storage diffusion regions 106, the impurity is boron (B), the energy is 5 KeV-10 KeV, and the dose is 5E13-1E15.

What are described above are just exemplary embodiments of the disclosure, which are not used to limit the disclosure. Any modification, equivalent replacement, improvement and the like made within the spirit and rule of the disclosure shall be included in the scope of protection of the disclosure.

What is claimed is:
1. A method for making a global shutter CMOS image sensor comprising,
forming N rows of pixel units sequentially arranged from the front to the rear, wherein forming each pixel unit includes forming a first resetting region (105), a global shutter transistor (M1), a photodiode, a first transfer transistor (M2), a storage diffusion region (106), a second transfer transistor (M3), a floating diffusion region (108), a reset transistor (M4), and a second resetting region (109) arranged in turn;
wherein the photodiode comprises a second conducting type semiconductor layer (101) and a first conducting type first photosensitive doped region (103) formed on a top of the second conducting type semiconductor layer (101);
wherein the storage diffusion region (106) comprises a first conductivity type, and a gate structure of the first transfer transistor (M2) is formed at a top of the second conducting type semiconductor layer (101) between the first conducting type first photosensitive doped region (103) and the storage diffusion region (106);
wherein the first resetting region (105) comprises the first conductivity type, the first resetting region (105) is connected to power supply voltage, and a gate structure of the global shutter transistor (M1) is formed at the top of the second conducting type semiconductor layer (101) between the first conducting type first photosensitive doped region (103) and the first resetting region (105);
forming a pinned layer (104) comprising a second conductivity type on a surface of the first conducting type first photosensitive doped region (103);
forming a gate structure of the second transfer transistor (M3) at the top of the second conducting type semiconductor layer (101) between the floating diffusion region (108) and the storage diffusion region (106);
forming a gate structure of the reset transistor (M4) between the floating diffusion region (108) and the second resetting region (109);
the second resetting region (109) comprising the first conductivity type, and the second resetting region (109) is connected to the power supply voltage;
wherein the floating diffusion region (108) and the second resetting region (109) are formed in a second conducting type well (107);
wherein a dopant concentration of the first conductivity type in the storage diffusion regions (106) of a front M rows of the N rows of pixel units is less than a dopant concentration of the first conductivity type in the storage diffusion regions (106) of remaining rear N-M rows, wherein N is an integer greater than 10, and M is an integer less than or equal to N/2;
performing a first shallow layer ion implantation and a second shallow layer ion implantation to form the storage diffusion regions (106) of the N rows of pixel units;
wherein the first shallow layer ion implantation comprises implanting ions of the first conductivity type into storage diffusion regions (106) of all of the N rows of pixel units; and
wherein the second shallow layer ion implantation comprises implanting ions of the second conductivity type into storage diffusion regions (106) of only the front M rows of the N rows of pixel units.

2. The method for making the global shutter CMOS image sensor according to claim 1,
wherein the first shallow layer ion implantation is performed in the entire storage diffusion regions (106); and
the second shallow layer ion implantation is performed at positions where the storage diffusion regions (106) are adjacent to the first transfer transistors (M2).

3. The method for making the global shutter CMOS image sensor according to claim 1,
wherein the first conductivity type is N-type and the second conductivity type is P-type;
wherein performing the first shallow layer ion implantation comprises implanting phosphorus, at an energy of 15 KeV-45 KeV, and a dose of 1E12-4E13; and
wherein performing the second shallow layer ion implantation comprises implanting boron, at an energy of 5 KeV-10 KeV, and a dose of 5E13-1E15.

4. The method for making the global shutter CMOS image sensor according to claim 1, wherein the first conductivity type is N-type and the second conductivity type is P-type; or, the first conductivity type is P-type and the second conductivity type is N-type.

5. The method for making the global shutter CMOS image sensor according to claim 1,
  wherein the second conducting type semiconductor layer (101) is a silicon layer;
  the first conducting type first photosensitive doped region (103) is an ion implantation region;
  a first conducting type first photosensitive lightly-doped region (1030) is formed in the second conducting type semiconductor layer (101);
  the first conducting type first photosensitive lightly-doped region (1030) is located below the first conducting type first photosensitive doped region (103) and extends horizontally below the first transfer transistor (M2); and
  a dopant concentration of the first conductivity type in the first photosensitive lightly-doped region (1030) is less than a dopant concentration of the first conductivity type in the first photosensitive doped region (103).

6. The method for making the global shutter CMOS image sensor according to claim 1, wherein each pixel unit of the global shutter CMOS image sensor further comprises
  an amplify transistor (M5) and a select transistor (M6);
  a gate of the amplify transistor (M5) is connected with the floating diffusion region (108);
  a source of the amplify transistor (M5) outputs an amplified signal;
  a drain of the amplify transistor (M5) is connected to the power supply voltage;
  the select transistor (M6) is used to select and output an amplified signal output by the amplify transistor (M5); and
  a gate of the select transistor (M6) is connected to a select signal.

7. The method for making the global shutter CMOS image sensor according to claim 1, wherein a shallow trench isolation (102) surrounds a peripheral side of each pixel unit of the global shutter CMOS image sensor.

8. The method for making the global shutter CMOS image sensor according to claim 1, wherein the gate structure of each transistor in the global shutter CMOS image sensor comprises a gate dielectric layer (110) and a polysilicon gate (111) in a superposed manner.

* * * * *